United States Patent [19]
Takaki

[11] Patent Number: 5,999,559
[45] Date of Patent: Dec. 7, 1999

[54] RADIO RECEIVER FOR SPREAD SPECTRUM SIGNAL

[75] Inventor: Tetsuya Takaki, Tokyo, Japan

[73] Assignee: NEC Corporation, Japan

[21] Appl. No.: 09/102,348

[22] Filed: Jun. 22, 1998

[30] Foreign Application Priority Data

Jun. 23, 1997 [JP] Japan .................................. 9-166104

[51] Int. Cl.[6] .................................................. H04B 1/69
[52] U.S. Cl. .................... 375/200; 375/316; 455/249.1; 455/253.2
[58] Field of Search .................................... 375/200, 345, 375/316; 455/234.1, 245.1, 249.1, 253.2, 232.1

[56] References Cited

U.S. PATENT DOCUMENTS 5,909,645  6/1999  Abramsky et al. .................. 455/249.1

FOREIGN PATENT DOCUMENTS 5-335857  12/1993  Japan .
7-106993   4/1995  Japan .
8-18469    1/1996  Japan .
8-186507   7/1996  Japan .
94 03002   2/1994  WIPO .

*Primary Examiner*—Temesghen Ghebretinsae
*Attorney, Agent, or Firm*—Ostrolenk, Faber, Gerb & Soffen, LLP

[57] ABSTRACT

A radio receiver is provided, which prevents the sensitivity of the receiver from degrading even if the receiver is applied to a communication system using a plurality of channels with unequal transmission powers. This radio receiver is comprised of an antenna for receiving a wanted RF signal; a variable-gain RF amplifier for amplifying the wanted RF signal to output an amplified, gain-controlled RF signal, a frequency converter for frequency-converting the amplified, gain-controlled RF signal to output an IF signal, a variable gain IF amplifier for amplifying the IF signal to output an amplified, gain-controlled IF signal, a despreader for despreading the amplified, gain-controlled IF signal to output a baseband signal, a Fourier transformer for conducting a Fourier transformation with respect to the baseband signal, a jamming-wave detector for detecting a jamming wave existing in a frequency range of the wanted RF signal, a demodulator for demodulating the baseband signal to output an information signal, an error-rate calculator for calculating an error rate of the information signal, and a controller for controlling gains of the variable-gain RF amplifier and the variable-gain IF amplifier.

4 Claims, 6 Drawing Sheets

RADIO RECEIVER FOR SPREAD SPECTRUM SIGNAL

BACKGROUND OF THE INVENTION

1. Field of the Invention

The present invention relates to a radio receiver and more particularly, to a radio receiver for receiving a spread spectrum signal bearing an information or message the bandwidth of which has been spread out to a wider bandwidth in a transmitter.

2. Description of the Prior Art

When two or more jamming waves whose frequencies are outside the frequency range of a wanted signal wave are received by a radio receiver used for mobile phones or selective calling, the signal wave may be affected by the jamming waves. This is because the two or more jamming waves may be mixed together due to the nonlinear characteristics of the receiver, thereby generating a mixed jamming wave whose frequency is inside the frequency range of the wanted signal wave. This problem has been known as the "inter-modulation (TM)" and considered as an important factor that affects the characteristic or performance of the receiver.

If the inter-modulation occurs, in spite of the sufficient strength or intensity of the electric field of the wanted signal wave, the bit error rate will degrade in digital communication and the SINAD will degrade in analog communication. Here, the abbreviation "SINAD" mean the ratio of Signal, Noise, and Distortion to Noise and Distortion.

To prevent the received signal strength from degrading due to the TM-induced jamming wave, various improved receivers of this sort have been developed and reported.

An example of the conventional radio receivers is shown in FIG. 1, which is disclosed in the Japanese Non-Examined Patent Publication No. 5-335857 published in 1993.

In FIG. 1, a signal wave that has been transmitted from a base station (not shown) is received by an antenna 101. The signal wave thus received is amplified by an Radio-Frequency (RF) amplifier 102 and then applied to a RF filter 104 through a variable attenuator 103. The bandwidth of the signal wave is limited by the RP filter 104. The signal wave whose bandwidth is limited is then divided into the In-phase (I) component and the Quadrature (Q) component, and the I and Q components are applied to frequency mixers or converters 105 and 106, respectively.

The frequency mixer 106 is applied with a load signal of a specific local frequency outputted from a local oscillator 107. On the other hand, the local signal is applied to a phase shifter 108 and is phase-shifted by ($\pi/2$), resulting in a phase-shifted local signal. The phase-shifted local signal is applied to the frequency mixer 105.

In the frequency mixer 105, the I component of the signal wave is frequency-mixed with the phase-shifted local signal. The frequency-mixer I component of the signal wave is then applied to a baseband filter 109, resulting in the I component in the baseband frequency range. The I component of the signal wave in the baseband frequency range is further applied to a demodulator 111.

In the frequency mixer 106, the Q component of the signal wave is frequency-mixed with the local signal. The frequency-mixed Q component of the signal wave is then applied to a baseband filter 110, resulting in the Q component in the baseband frequency range. The Q component of the signal wave in the baseband frequency range is further applied to the demodulator 111.

The I and Q components of the signal wave are digitally demodulated in the demodulator 111 to thereby recover a digital information signal transmitted by the received signal wave. The digital information signal is then applied to a controller circuit 112.

In the controller circuit 112, the frame synchronization signal included in the demodulated information signal is detected. If the frame synchronization signal is not detected within a specific period of time, the controller 112 treats the demodulated information signal as de-synchronized and informs a gain controller 113 of the de-synchronization. To respond this information, the gain controller 113 controls the attenuation amount of the variable attenuator 103.

Thereafter, the same procedure as above is repeated until the frame synchronization signal included in the demodulated information signal is detected in the controller circuit 112. When the frame synchronization signal included in the demodulated information signal is detected in the controller circuit 112, the attenuation amount of the variable attenuator 103 is returned to its original value.

With the conventional radio receiver shown in FIG. 1, as described above, the attenuation amount of the variable attenuator 103 is estimated in advance. Then, if the frame synchronization signal is not detected within a specific period of time in spite of the sufficient strength or intensity of the electric field of the wanted signal wave, the controller 112 treats the demodulated information signal by the demodulator 111 as de-synchronized (i.e., occurrence of the inter-modulation) and controls the attenuation amount of the variable attenuator 103 through the gain controller 113.

Thus, the jamming waves induced by the inter-modulation that occurs in the subsequent stages to the variable attenuator 103 are able to be suppressed.

Another example of the conventional radio receivers is shown in FIG. 2, which is disclosed in the Japanese Non-Examined Patent Publication No. 7-106993 published in 1995.

In FIG. 2, a signal wave that has been transmitted from a base station (not shown) is received by an antenna 201. The received signal is then applied to a RF switch 203 through a branching filter 202. The RF switch 203 sends the received signal to a RF filter 205 directly or through a RF amplifier 204 according to a control signal outputted from a logic circuit 215.

When the received signal is sent to the RF filter 205 through the RF amplifier 204, the received signal is amplified by the RF amplifier 204 and then, it is inputted into the RF filter 205. On the other hand, when the received signal is directly sent to the RF filter 205, then received signal is directly inputted into the RF filter 205 without amplification. The RF filter 205 removes the unnecessary waves outside the frequency range of the received signal.

A first frequency converter or mixer 206 frequency-converts the received signal using a first local signal generated by a first local oscillator 216, thereby producing a first Intermediate-Frequency (IF) signal. The frequency range of the first IF signal is limited by an IF filter 207.

A second frequency converter or mixer 208 frequency-converts the received signal thus frequency-range-limited using a second local signal generated by a second local oscillator 217, thereby producing a second IF signal. The second IF signal is then amplified by an IF amplifier 209. The amplified second IF signal is inputted into a field-strength detector circuit 210 and a demodulator circuit 211.

The demodulator circuit 211 demodulates the amplified second IF signal thus inputted and outputs a demodulated signal to a line-quality detector circuit 212 and an audio codec 213. The audio codec 213 converts the demodulated signal to an audio signal and drives a speaker 214 according to the audio signal.

The field-strength detector circuit 210 outputs a high-level (H) output signal to a logic circuit 215 when the electric-field strength of the received signal wave is equal to or greater than a specific level, and a low-level (L) output signal to the logic circuit 215 when the electric-field strength of the received signal wave is less than the specific level.

The line-quality detector circuit 212 detects the line quality and outputs a high-level (H) output signal to the logic circuit 215 when the line quality is greater than a specific level, and a low-level (L) output signal to the logic circuit 215 when the line quality is equal to or less than the specific level.

The logic circuit 215 controls the switching operation of the RF switch 203 according to the output signals of the field-strength detector circuit 210 and the line-quality detector circuit 212.

Specifically, when the output signal of the field-strength detector circuit 210 is in the L level, the logic circuit 215 controls the RF switch 203 so that the output of the branching filter 202 is sent to the RF amplifier 204, which is independent of the level of the output signal of the line-quality detector circuit 212.

When the output signals of the field-strength detector circuit 210 and line-quality detector circuit 212 are in the H level, the logic circuit 215 controls the RF switch 203 so that the output of the branching filter 202 is sent to the RF amplifier 204.

When the output signal of the field-strength detector circuit 210 is in the H level, and the output signal of the line-quality detector circuit 212 is in the L level, the logic circuit 215 controls the RF switch 203 so that the output of the branching filter 202 is directly sent to the RF filter 205.

With the conventional radio receiver shown in FIG. 2, as described above, when the electric-field strength of the received signal wave is large enough (i.e., equal to or greater than the specific level) and at the same time, the line quality is excessively degraded (i.e., equal to or less than the specific level), the logic circuit 215 controls the RF switch 203 so that the received signal wave outputted from the branching filter 202 is directly sent to the RF filter 205 while bypassing the RF amplifier 204.

Thus, if a plurality of jamming waves exist, the received signal wave is inputted into the first frequency converter 206 without amplification. This means that the jamming signal induced by the inter-modulation or cross-modulation in the first frequency converter 206 is able to be suppressed.

However, the above-described conventional radio receivers shown in FIGS. 1 and 2 have the following problems.

With the conventional radio receiver shown in FIG. 1, as described above, the sensitivity degradation of the receiver is judged by detecting the frame synchronization signal. Therefore, if this radio receiver is applied to the communicating system using a plurality of channels whose transmission powers are different from one another, the sensitivity degradation of the receiver is not always suppressed.

For example, in the mobile communication system regulated by the Telecommunications Industry Association (TIA) as the Interim Standard 95 (IS95) in north America, three channels, i.e., the pilot channel, the traffic channel, and the synchronization channel are used. The pilot channel (PLT) is used to transmit the synchronization signal with the spreading code in the transmitter. The traffic channel (TRF) is used to transmit the information to be transmitted, which is scrambled. The synchronization channel (SYNC) is used to transmit the synchronization signal with the frame in the transmitter and the releasing or removing signal for the scramble in the traffic channel. The transmission power of these three channels are set to satisfy the relationship of PLT:TRF:SYNC=3:1:1.

In this mobile communication system, the pilot channel signal is transmitted with a higher electric power than those of the traffic and synchronization channel signals. Therefore, even if the receiver is synchronized with the spreading code in the transmitter through the pilot channel, the synchronization channel may be affected by the inter-modulation or cross modulation. This means that the scramble in the traffic channel is unable to be removed.

As a result, even if the receiver is able to be synchronized with the spreading code in the transmitter through the pilot channel, the sensitivity degradation (or, the electric-field strength lowering) of the receiver may take place due to the inter- or cross-modulation. This is a first problem of the conventional radio receiver shown in FIG. 1.

A second problem of the conventional radio receiver shown in FIG. 1 is that the demodulator 111 needs to have a very wide dynamic range. This is caused by the fact that the electric-field strength of the received signal wave is controlled or adjusted by the variable attenuator 103 and therefore, the level of electric-field strength of the demodulated signal inputted into the demodulator 111 is not kept in a specific level.

For example, if the attenuation amount of the variable attenuator 103 is increased to suppress the effect of the jamming wave, the electric-field strength of the received signal wave will be lowered compared with the case where no jamming wave exists.

A problem of the conventional radio receiver shown in FIG. 2 is that the demodulator 211 needs to have a very wide dynamic range. This is caused by the fact that the electric-field strength of the received signal wave and the line quality are monitored and then, the electric-field strength of the received signal wave is controlled or adjusted by the RF switch 203 through the logic circuit 215 according to the monitoring result. Therefore, the level of electric-field strength of the demodulated signal inputted into the demodulator 211 is not kept in a specific level.

For example, if the received signal wave is not amplified by the RF amplifier 204 to suppress the effect of the jamming wave, the electric-field strength of the received signal wave will be lowered compared with the case where no jamming wave exists.

SUMMARY OF THE INVENTION

Accordingly, an object of the present invention is to provide a radio receiver that prevents the sensitivity of the receiver from degrading even if the receiver is applied to a communication system using a plurality of channels with unequal transmission powers.

Another object of the present invention is to provide a radio receiver that prevents the sensitivity of the receiver from degrading even if a demodulator does not have a wide dynamic range.

The above objects together with others not specifically mentioned will become clear to those skilled in the art from the following description.

A radio receiver according to the present invention is comprised of an antenna for receiving a wanted RF signal, a variable-gain RF amplifier for amplifying the wanted RF signal to output an amplified, gain-controlled RF signal, a frequency converter for frequency-converting the amplified, gain-controlled RF signal to output an IF signal, a variable-gain IF amplifier for amplifying the IF signal to output an amplified, gain-controlled IF signal, a despreader for despreading the amplified, gain-controlled IF signal to output a baseband signal, a demodulator for demodulating the baseband signal to output an information signal, a Fourier transformer for conducting a Fourier transformation with respect to the baseband signal, a jamming-wave detector for detecting a jamming wave existing in a frequency range of the wanted RF signal, an error-rate calculator for calculating an error rate of the information signal. and a controller for controlling gains of the variable-gain RF amplifier and the variable-gain IF amplifier.

With the radio receiver according to the present invention, the error rate of the information signal is calculated by the error-rate calculator and then, the gains of the variable-gain RF amplifier and the variable-gain IF amplifier are controlled by the controller based on the calculation result of the error rate.

Therefore the sensitivity of the receiver is prevented from degrading even if the receiver is applied to a communication system using a plurality of channels with unequal transmission powers.

Also, the gains of the variable-gain RF amplifier and the variable-gain IF amplifier are controlled by the controller so that the electric-field strength of the baseband signal is kept constant at the input of the demodulator. Thus, the sensitivity of the receiver is prevented from degrading even if the demodulator does not have a wide dynamic range.

In a preferred embodiment of the present invention, the variable-gain RF amplifier is formed by a variable-gain attenuator and a fixed-gain RF amplifier.

In another preferred embodiment of the present invention, a gain of the variable-gain RF amplifier is set as the lowest value at the start of operation.

In still another preferred embodiment of the present invention, existence and absence of a jamming wave is judged by searching a peak greater than a threshold level in a spectrum obtained by Fourier transformation.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
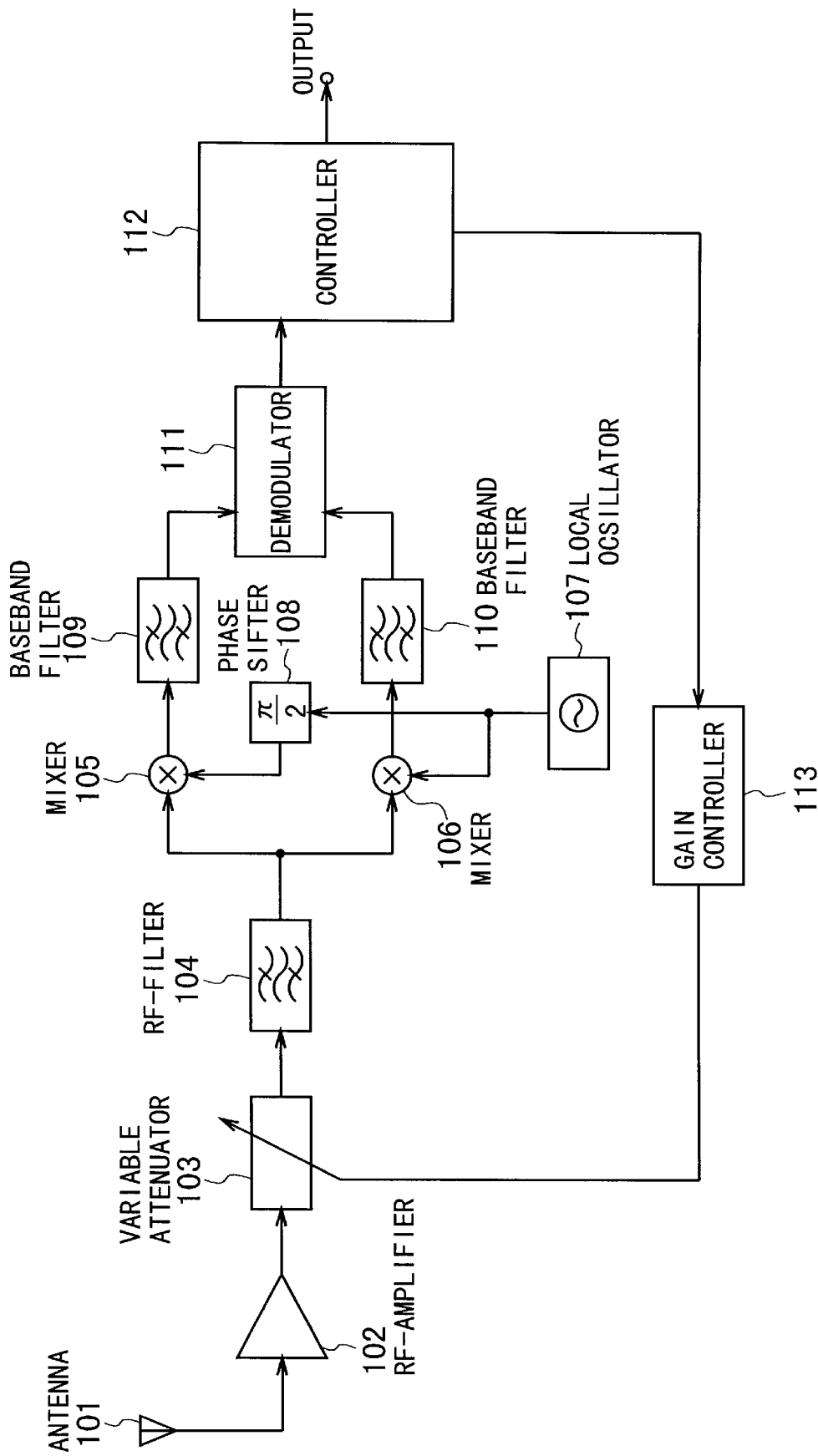
FIG. 1 is a block diagram showing a conventional radio receiver.
Figure 2:
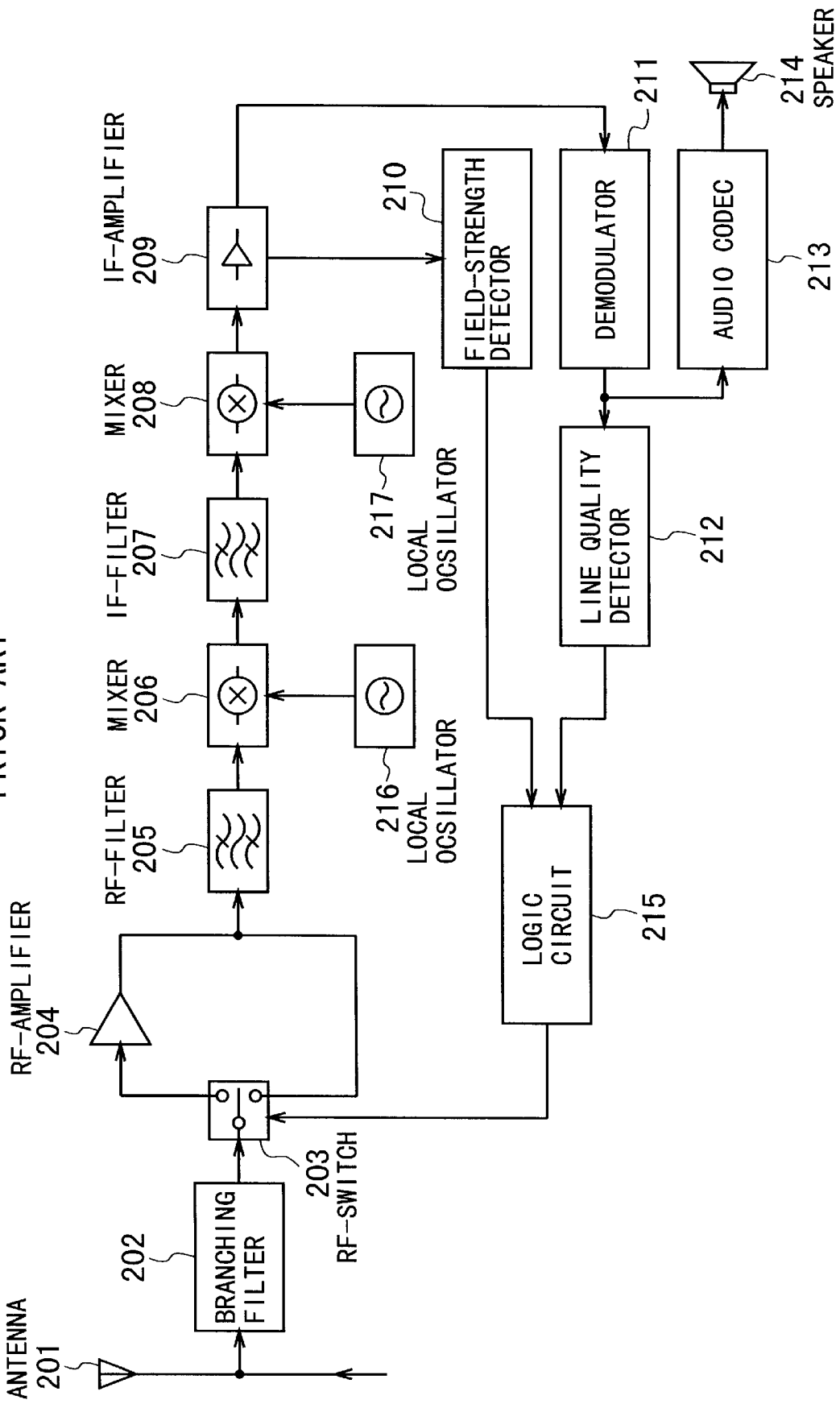
FIG. 2 is a block diagram showing another conventional radio receiver.

Preferred embodiments of the present invention will be described in detail below while referring to the drawings attached.

Figure 3:
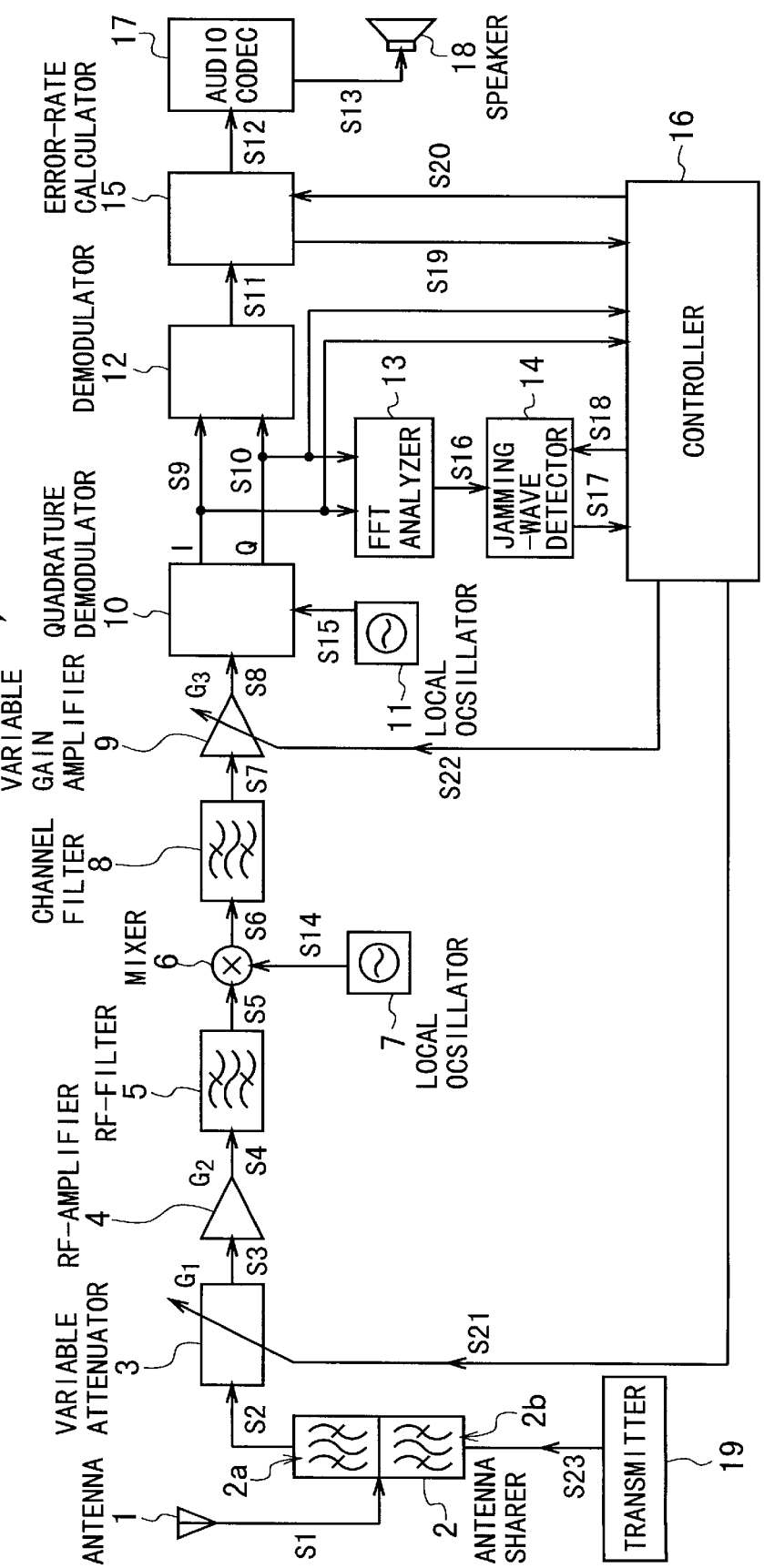
FIG. 3 is a block diagram showing a radio receiver according to an embodiment of the present invention.

FIG. 3 shows the configuration of a radio receiver 20 according to an embodiment of the present invention.

In this receiver 20, as shown in FIG. 3 a common antenna 1 receives various waves that have been transmitted from a base station (not shown). Information signals S1 transmitted by the waves thus received are sent to an antenna sharer 2 having a receiving filter 2a and a transmitting filter 2b and then, unnecessary ones of the received waves are removed by the receiving filter 2a. Thus, a wanted information signal S2 is selected and sent to a variable attenuator 3 having a variable gain G1.

An information signal S23 to be transmitted by a transmitter 19 is sent to the transmitting filter 2b and then, it is transmitted from the antenna 1 while unnecessary signals are removed by the transmitting filter 2b.

The variable attenuator 3, which serves as a first gain controller for controlling the gain of the signal S2, outputs an attenuated signal S3 to a RF amplifier 4 with a fixed gain G2.

The RF amplifier 4 amplifies the attenuated signal S3 at the gain G2 and outputs an amplified signal S4 to a RF filter 5.

The RF filter 5 allows the RF components of the amplified signal S4 to pass through. The filtered signal by this filter 5 is defines as S5.

A frequency mixer or converter 6 converts the filtered signal S5 to an IF signal S6 of an IF range using a local signal S14 of a first local frequency that is outputted from a first local oscillator 7. The IF signal S6 is then sent to a channel filter 8.

The channel filter 8 allows the IF signal S6 to pass through. The IF signal filtered by this filter 8 is defines as S7.

A variable-gain amplifier 9 with a variable gain G3 amplifies the IF signal S7 and outputs an IF amplified signal S8. The variable-gain amplifier 9 serves as a second gain controller for controlling the gain of the signal S7.

A quadrature demodulator 10 frequency mixes the amplified IF signal S8 with a second local signal with a second local frequency that is outputted from a second local oscillator 11, thereby quadrature-demodulating the amplified IF signal S8. Thus, the I and Q components S9 and S10 of the baseband frequency are outputted to a demodulator 12, a FFT analyzer 13, and a controller circuit 16.

The demodulator 12 demodulates the baseband I and Q components S9 and S10 and outputs an information signal S11 to an error-rate calculator 15.

The error-rate calculator 15 calculates the bit error rate of the demodulated baseband signal S11 and outputs a signal S12 to an audio codec 17 and a signal S20 to the controller circuit 16.

The audio codec 17 outputs a signal S13 to drive a speaker 18 according to the signal S12 from the error-rate calculator 15.

The FFT analyzer 13 conducts a Fast Fourier transformation (FFT) using the baseband I and Q components S9 and S10 and outputs a signal S16 to a jamming-wave detector 14.

The detector 14 searches the signal S16 and judges whether a jamming wave exists in the received signal S2 due to inter- or cross-modulation or not. The detector 14 outputs a result signal S17 to the controller circuit 16.

The controller circuit 16 calculates the electric power of the received signal S2 based on the I and Q components S9 and S10 sent from the quadrature demodulator 10. The controller circuit 16 outputs control signals S18 and S20 to the jamming-wave detector 14 and the error-rate calculator 15, respectively. Further, the controller circuit 16 outputs control signals S21 and S22 to the variable attenuator 3 and the variable-gain amplifier 9, respectively.

Figure 6A:
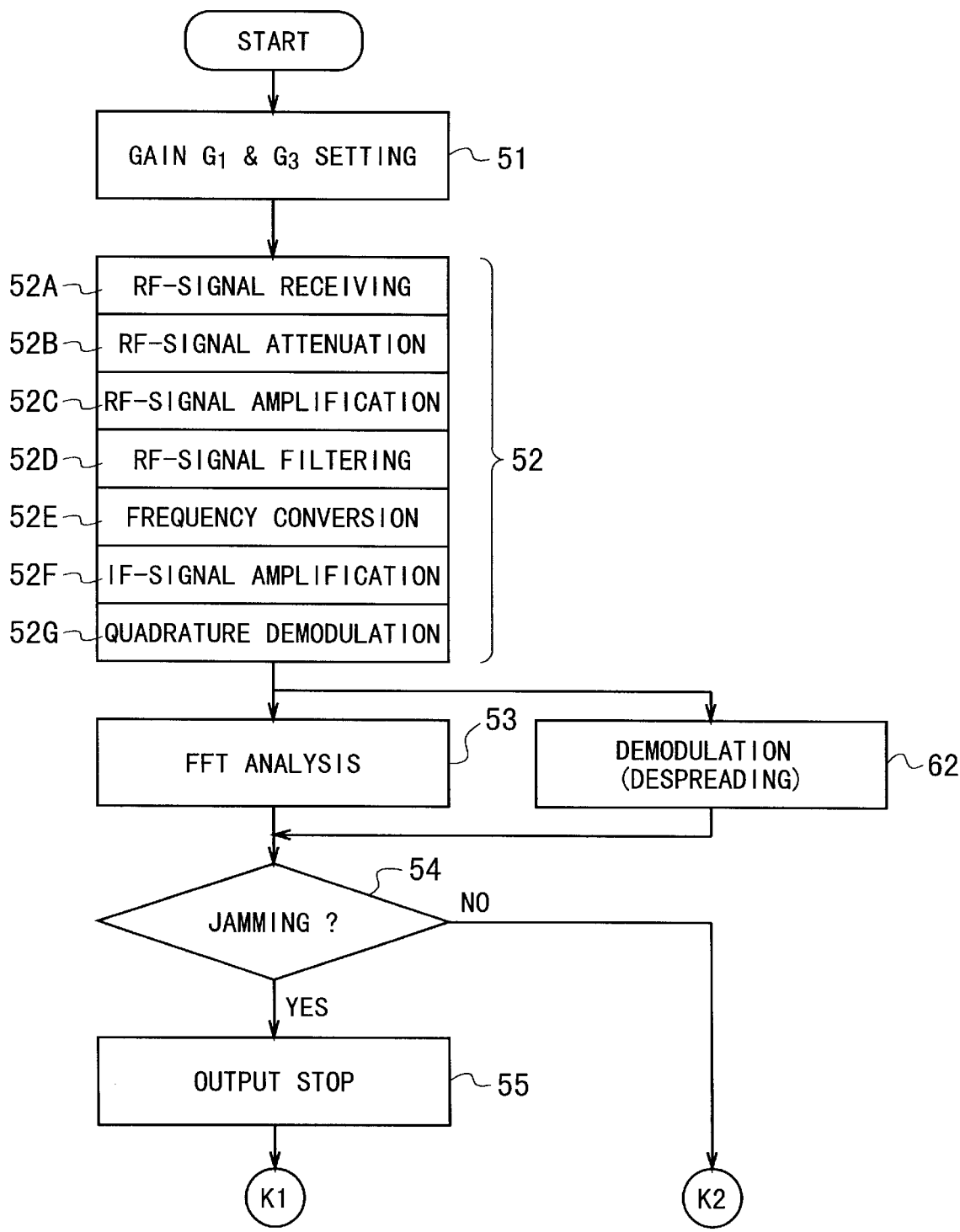
FIG. 6A is a flowchart showing the process steps of the receiving method in the radio receiver according to the embodiment of the present invention.
Figure 6B:
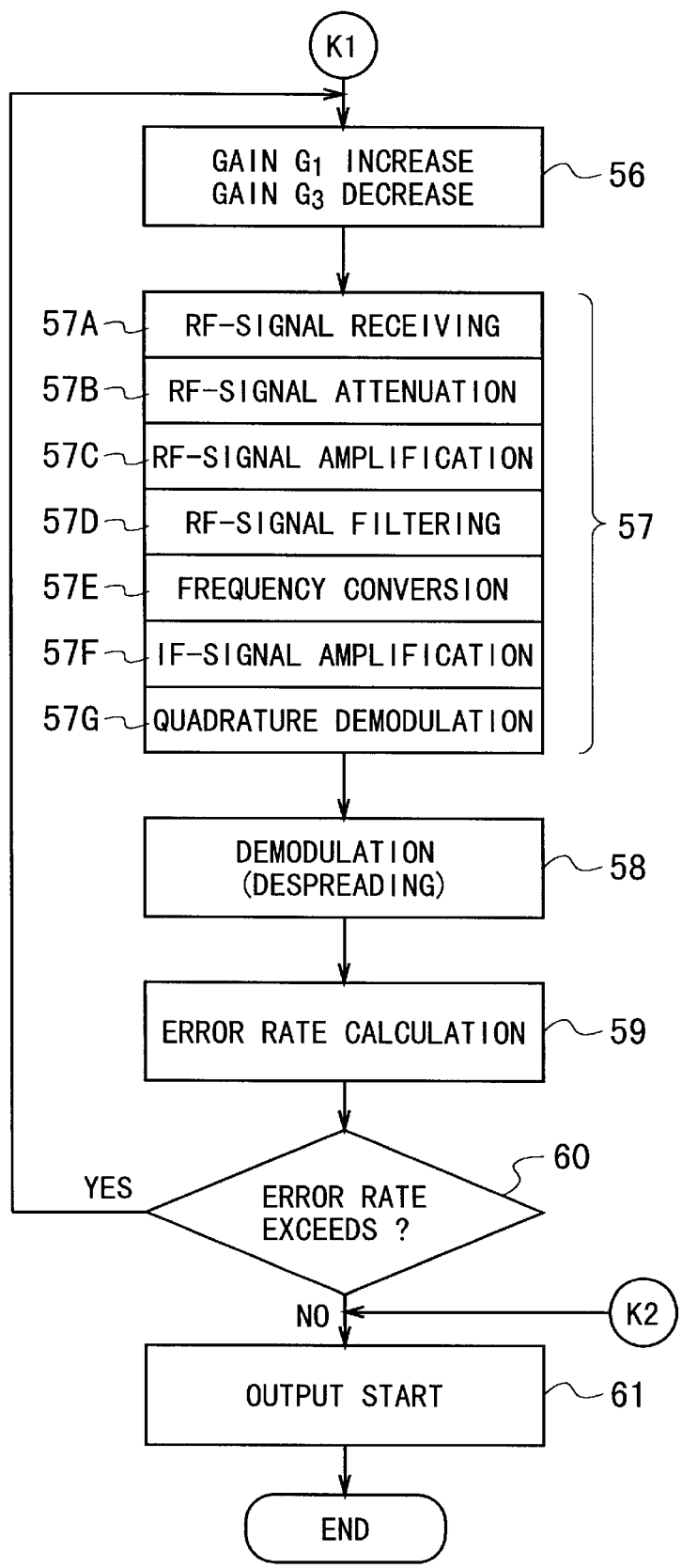
FIG. 6B is a flowchart showing the process steps of the receiving method in the radio receiver according to the embodiment of the present invention.

Next, the operation of the radio receiver 20 according to the embodiment of FIG. 3 is explained below with the reference to FIGS. 6A and 6B.

In the step 51, the gain G1 of the variable attenuator 3 is set as the lowest value by the controller circuit 16 through the control signal S21. At the same time, the gain C3 of the variable-gain amplifier 9 is set as a predetermined initial value by the controller circuit 16 through the control signal S22.

Here, the gains G1 and G3 are adjusted proportional to the voltage values of the control signals S21 and S22, respectively.

In the step 52, a sequence from signal receiving to quadrature demodulation is performed.

Specifically, in the substep 52A, the transmitted signal waves S1 are received by the antenna 1 and the wanted RF signal S2 is selected by the antenna sharer 2.

In the substep 52B, the wanted RF signal S2 is attenuated by the attenuator 3 according to the adjusted gain G1.

In the substep 52C, the attenuated RF signal S3 is amplified by the RF amplifier 4 according to the fixed gain G2.

In the substep 52D, the amplified RF signal S4 is filtered by the RF filter 5 so that the components of the RF frequencies of the signal S4 are passed through the filter 5.

In the substep 52E, the filtered RF signal S5 is frequency-converted by the mixer 6 by mixing the frequency of the RF signal S5 with the local frequency of the first local signal S14, thereby producing the IF signal S6. The IF signal S6 thus produced is then filtered by the channel filter 8 to select the wanted channel, resulting in the filtered IF signal S7.

In the substep 52F, the filtered IF signal S7 is amplified by the variable-gain amplifier 9 according to the adjusted gain G3. The gain G3 is controlled so that the electric-field strength of the amplified IF signal S8 is kept constant independent of the electric-field strength of the input IF signal S7.

In the substep 52G, the amplified signal S8 whose electric-field strength is kept constant is subjected to the quadrature demodulation by the demodulator 10 using the second local signal S15 from the second local oscillator 11. Thus, the Q and I component signals S9 and S10 of the baseband frequencies are produced.

In the step 53, a Fast Fourier transformation (FFT) analysis for the Q and I component signals S9 and S10 of the baseband frequencies is conducted by the FFT analyzer 13. The result of this FFT analysis is sent to the jamming-wave detector 14 as the signal S16.

Figure 4:
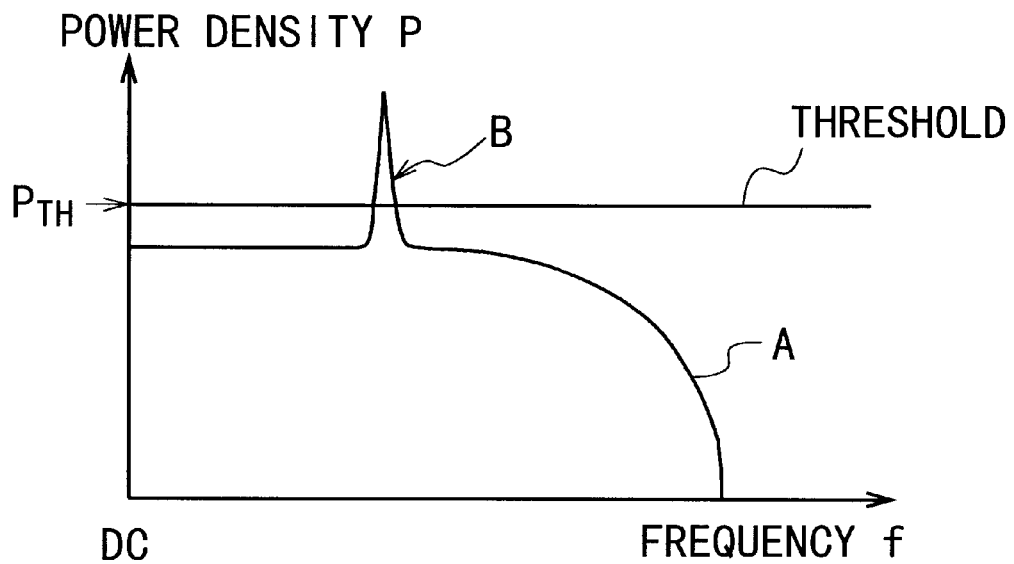
FIG. 4 is a graph showing the electric power spectrum obtained by FFT in the radio receiver according to the embodiment of the present invention, where an intermodulation-induced jamming wave exists.
Figure 5:
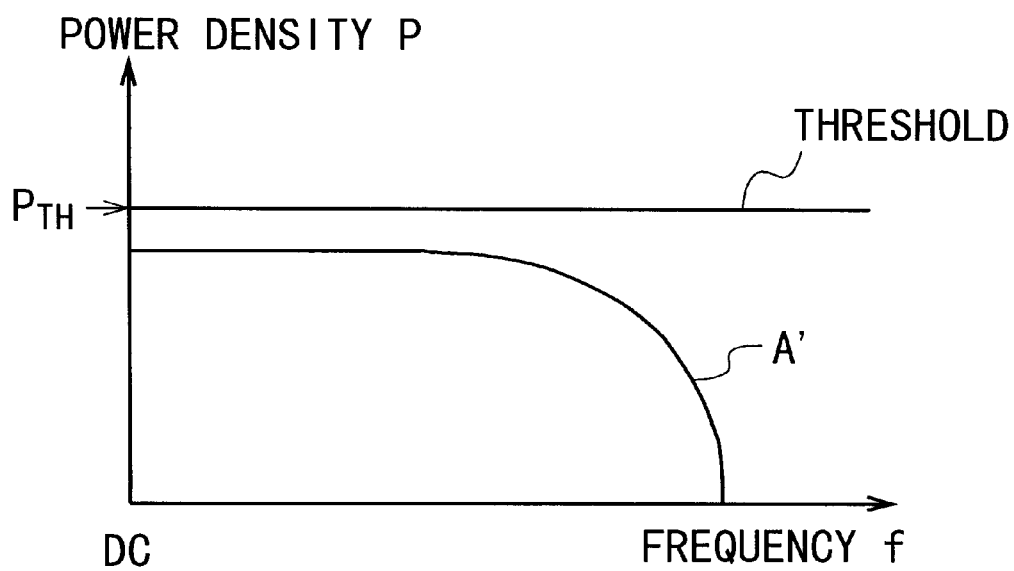
FIG. 5 is a graph showing the electric power spectrum obtained by FFT in the radio receiver according to the embodiment of the present invention, where no intermodulation-induced jamming wave exists.

FIGS. 4 and 5 schematically show the power density spectra obtained by the FFT analysis in the step S53.

When some jamming wave exists, as shown in FIG. 4, the curve A of the power density has a peak B greater than the threshold level $P_{TH}$ of the power density P at a specific frequency $\mathcal{L}$. On the other hand, when no jamming wave exists, as shown in FIG. 5, the curve A' of the power density has no peak. Therefore, the existence of the jamming wave is able to be found by searching existence and absence of the peak B in the power density spectrum.

The frequency range to be observed in the FFT analysis is the same as the expanded bandwidth given by spreading out. The sampling or integrating frequency width is the same as the non-spread, narrow bandwidth.

Returning to FIGS. 6A and 6B, in the step 62, the Q and I component signals S9 and S10 of the baseband frequencies are demodulated by the demodulator 12, thereby outputting the signal S11 to the error-rate calculator 15.

In the steps 54, based on the result of the FFT analysis in the step 53, it is judged whether some jamming signal or wave exists or not.

When the answer is "No" in the step 60, which means that no jamming wave exists, the jamming-wave detector 14 sends the signal S17 to the controller circuit 16, thereby informing the controller circuit 16 of the absence of the jamming wave. Then, the controller 16 sends the control signal S20 to the error-rate calculator 15, thereby starting the output of the error-rate calculator 15 to the audio codec 17 in the step 61.

When the answer is "Yes" in the step 60, which means that some jamming wave exists, the jamming-wave detector 14 sends the signal S17 to the controller circuit 16, thereby informing the controller circuit 16 of the existence of the jamming wave. Then, the controller 16 sends the control signal S20 to the error-rate calculator 15, thereby stopping the output of the error-rate calculator 15 to the audio codec 17 in the step 55.

Simultaneously, in this case, the controller circuit 16 adjusts the gains G1 and G3 of the variable attenuator 3 and the variable-gain amplifier 9 by a predetermined value with the use of the control signals S21 and S22. That is, as shown in the step 56, the gain G1 is increased by a predetermined increment and/or the gain G3 is decreased by a predetermined decrement. Subsequently, the step 57 including the substeps 57A to 57G is performed with respect to the next frame of the transmitted signals S1, where the substeps 57A to 57G are substantially the same as the substeps 52A to 52G in the step 52, respectively.

In the step 58, like the step 62, the Q and I component signals S9 and S10 of the baseband frequencies are demodulated by the demodulator 12, thereby outputting the signal S11 to the error-rate calculator 15.

In the step 59, the error-rate calculator 15 calculates the bit error rate in the baseband signal S11. The error-rate data thus calculated is sent to the controller circuit 16 as the signal S19.

In the step 60, the controller circuit 16 judges whether the value of the calculated error rate exceeds a predetermined reference value or not.

When the answer is "Yes" in the step 60, which means that the value of the calculated error rate exceeds the reference value, the flow is returned to the step 56. Then, the controller circuit 16 changes the gain G1 and/or G2 again in the step 56 and the steps 57 to 60 are repeated until the answer is "No".

When the answer is "No" in the step 60, which means that the value of the calculated error rate does not exceed the reference value, the flow is progressed to the step 61. Then, the controller circuit 16 sends the signal S29 to the error-rate calculator 15, thereby informing the controller circuit 16 of the non-excess of the error rate.

Then, the controller 16 sends the control signal S20 to the error-rate calculator 15, thereby starting the output of the calculator 15 to the audio codec 17 in the step 61. The bit-error rate calculation and the gain control are not performed in this case, because of no jamming wave.

With the radio receiver 20 according to the embodiment of the present invention, as described above, the bit error rate of the information signal S11 is calculated by the error-rate calculator 15 and then, the variable gain G1 of the variable-gain attenuator 3 and the variable gain G3 of the IF amplifier 9 are controlled by the controller circuit 16 based on the calculation result of the bit error rate.

Therefore the sensitivity of the radio receiver 20 is prevented from degrading even if the receiver 20 is applied to a communication system using a plurality of channels with unequal transmission powers such as the mobile communication system regulated by the TIA as the IS95 in north America.

Also, the gains of the variable-gain attenuator 3 and the variable-gain IF amplifier 9 are controlled by the controller circuit 16 so that the electric-field strength of the baseband signals S9 and S10 are kept constant at the input of the demodulator 12. Thus, the sensitivity of the receiver 20 is prevented from degrading even if the demodulator 12 does not have a wide dynamic range.

The radio receiver 20 according to the embodiment of the present invention is configured to decrease or suppress the n-th order distortion generated by the non-uniform operation or characteristic of the RF amplifier 4 and the RF frequency converter 5, where n is a constant greater than unity.

The n-th order distortion increases (or decreases) by $n\alpha$ decibels (dB) if the electric-field strength of the received signal wave is increased by an increment (or decrement) of $\alpha$ dB, where $\alpha$ is a positive constant. Considering this property or characteristic of the n-th order distortion, the variable attenuator 3 serving as a part of the variable-gain RF amplifier is located at the front end and the variable-gain amplifier 9 is located to amplify the IF signal S7. Moreover, the gains G1 and G3 of the variable-gain attenuator 3 and the variable-gain IF amplifier 9 are controlled by the controller circuit 16 so that the electric-field strength of the baseband signals S9 and S10 are kept constant at the input of the demodulator 12.

It is clear that the radio receiver 20 according to the embodiment of the present invention is designed for receiving an information-bearing signal wave whose bandwidth has been spread or expanded in a transmitting using the well-known spread spectrum technique.

However, the receiver 20 is effective if it is applied to the case where a first communication system using the spread or expanded bandwidth and a second communication system using the narrow (i.e., non-spread or non-expanded) bandwidth are simultaneously utilized in a common frequency range. This is because the signal waves used in the second communication system will become a jamming wave in the first communication system. An example of this case is the north America where the mobile communication system regulated by the TIA as the IS95 is applied.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A radio receiver using a spread-spectrum technique, comprising:

an antenna for receiving a wanted RF signal;

a variable-gain RF amplifier for amplifying said wanted RF signal to output an amplified, gain-controlled RF signal;

a frequency converter for frequency-converting said amplified, gain-controlled RF signal to output an IF signal;

a variable-gain IF amplifier for amplifying said IF signal to output an amplified, gain-controlled IF signal;

a despreader for despreading said amplified, gain-controlled IF signal to output a baseband signal;

a Fourier transformer for conducting a Fourier transformation with respect to said baseband signal;

a jamming-wave detector for detecting a jamming wave existing in a frequency range of said wanted RF signal;

a demodulator for demodulating said baseband signal to output an information signal;

an error-rate calculator for calculating an error rate of said information signal, and a controller for controlling gains of said variable gain RF amplifier and said variable-gain IF amplifier;

wherein the gains of said variable-gain RF amplifier and said variable-gain IF amplifier are controlled so that the electric-field strength of said baseband signal is kept constant at an input of said demodulator.

2. The receiver as claimed in claim 1, wherein said variable-gain RF amplifier is formed by a variable-gain attenuator and a fixed-gain RF amplifier.

3. The receiver as claimed in claim 1, wherein a gain of said variable-gain RF amplifier is set as the lowest value at the start of operation.

4. The receiver as claimed in claim 1, wherein existence and absence of a jamming wave is judged by searching a peak greater than a threshold level in a spectrum obtained by Fourier transformation.

* * * * *